United States Patent [19]
Chou

[11] Patent Number: 6,060,925
[45] Date of Patent: May 9, 2000

[54] SCHMITT-TRIGGER CIRCUIT WITH LOW POWER CONSUMPTION

[75] Inventor: Yung-Fa Chou, Kaohsiung, Taiwan

[73] Assignee: Taiwan Semiconductor Manufacturing Co., Ltd., Hsinchu, Taiwan

[21] Appl. No.: 09/129,835

[22] Filed: Aug. 6, 1998

[51] Int. Cl.[7] .................................................. H03K 3/3565
[52] U.S. Cl. ............................ 327/206; 327/73; 327/205; 327/208; 327/210
[58] Field of Search ..................................... 327/205, 206, 327/73, 210, 208

[56] References Cited

FOREIGN PATENT DOCUMENTS 62-136914  6/1987  Japan .

*Primary Examiner*—Timothy P. Callahan
*Assistant Examiner*—Hiep Nguyen
*Attorney, Agent, or Firm*—Harold L. Novick; Nath & Associates

[57] ABSTRACT

The present invention discloses a Schmitt-trigger circuit with less power consumption by reducing the amount of the required DC current. The Schmitt-trigger circuit disclosed in the present invention basically encompasses a comparison circuit, a first current cutting circuit, and a second current cutting circuit. The comparison circuit receives the input signal and then generates the output signal. Both the first and second current cutting circuits feed in the output signal, and then generate feedback signals to feed the comparison circuit for cutting the DC current path when the input signal rises or falls to predetermined trigger points. When there is only one of the first and second current cutting circuits is required, the higher or lower trigger point can be adjusted without necessary to vary the size-ratio of the PMOS and NMOS transistors.

15 Claims, 8 Drawing Sheets a

SCHMITT-TRIGGER CIRCUIT WITH LOW POWER CONSUMPTION

BACKGROUND OF THE INVENTION

1. Field of the Invention

The present invention relates to a circuit with less power consumption, and more particularly, to a Schmitt-trigger circuit that consumes less electrical power by reducing the amount of the required DC current.

2. Description of the Prior Art

In the present days, many kinds of electrical products are manufactured each day. Except high operation speed, these new products are usually designed to consume less power. This is a very important topic because the employed chips of the electrical products usually have higher package densities than before. Otherwise, the chips may be destroyed when they keep active for a time interval over than a threshold. Accordingly, it is thought to decrease the DC (Direct Current) current that is used to drive the chips for work.

Those chips, such as flip-flops and shift registers, start their operations when the voltage levels at the input terminals rise or fall. Sometimes, the waveform at the input terminal will be distorted, so that the rising or falling time must be also prolonged to prevent operation from error. Typically, the variation at the voltage level of the input signal will change the logic states of the sequent transistors. However, the voltage potential at the input terminal may remain near Vcc/2 whatever the input signal rise or fall. Therefore, the chip will generate unstable outputs even there is only little variation at the voltage level of the input signal. A requirement is thus arisen to design a circuit, such as Schmitt-trigger circuit that enlarges the signal margins for the input signal. Accordingly, the chips can work steadily even there are still fluctuations at the input signal.

Referring to FIG. 1, which represents a diagram illustrative of the Schmitt-trigger circuit used conventionally (please refer to U.S. Pat. No. 3,984,703). Obviously, the transistors 101, 102, 103, and 104 are connected in series, with their gates coupled together for receiving the input signal ($V_{in}$). The drains of the transistors 102 and 103, the gates of the transistors 105 and 106 are also tied together to derive the output signal ($V_{out}$) for pipeline operations. As noted, the transistors 102 and 103 are connected as a comparator, and these two transistors are coupled in series across a source potential $V_{cc}$ to ground. Transistors 101, 104, 105, and 106 are employed to be potential dividers, and each the above-mentioned potential divider is series connected across the source potential $V_{cc}$ to ground.

Although the Schmitt-trigger circuit of the FIG. 1 provides relatively high input impedance (about $10^{12}$ ohms), however, some disadvantages still offer from the conventional Schmitt-trigger circuit. For example, when $V_{in}$ changes (i.e., rises or falls) very slowly, all the transistors in the Schmitt-trigger circuit will be turned on simultaneously. In addition, because $V_{in}$ may be derived from a reference circuit, which indicates that the $V_{in}$ can not be always kept at the reference voltage levels (such as $V_{cc}$ or ground), all the transistors of the Schmitt-trigger circuit will be also simultaneously conducted. Therefore, there will be a DC current path from $V_{cc}$, through transistors 101, 102, 103, 104, to ground, and the DC current will be thought to consume additional and undesired electrical power. On the other hand, the size-ratio of the PMOS and NMOS transistors will be unbalanced if an extreme trigger point, such as higher or lower trigger point is required. Usually, it indicates that larger sizes of the PMOS and NMOS transistors will be needed to adjust the extreme trigger points, and more areas are occupied by the additional sizes of the transistors. A need has been arisen to disclose a Schmitt-trigger circuit for reducing the power consumption, and furthermore, to overcome the disadvantages of the conventional skills.

SUMMARY OF THE INVENTION

The principal object of the present invention is the provision of an improved Schmitt-trigger circuit that consumes less power than before.

The other object of the invention is to provide a Schmitt-trigger circuit for adjusting extreme trigger points without changing the size-ratio of the PMOS and NMOS transistors.

According to the aforementioned objects, the Schmitt-trigger circuit disclosed in the present invention basically encompasses a comparison circuit, a first current cutting circuit, and a second current cutting circuit. The comparison circuit receives the input signal and then generates the output signal. Both the first and second current cutting circuits feed in the output signal, and then generate feedback signals to the comparison circuit for cutting the DC current path when the input signal rises or falls to a predetermined trigger point. When there is only one of the first and second current cutting circuit is required, the higher or lower trigger point can be adjusted without necessary to vary the size-ratio of the PMOS and NMOS transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2A:
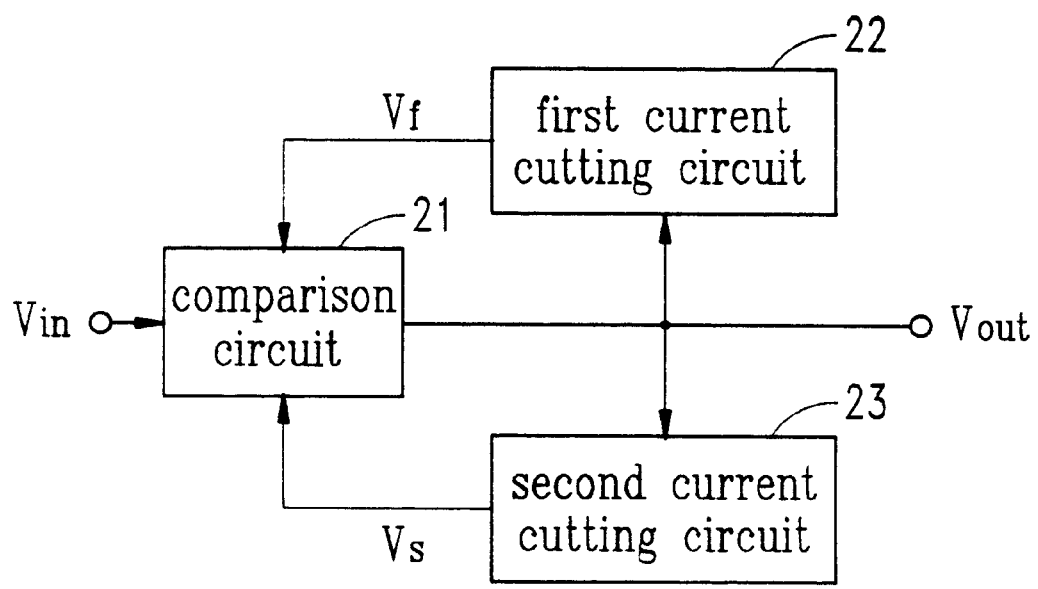
FIG. 2A is a schematic diagram illustrative of a Schmitt-trigger circuit according to the invention.

Referring to FIG. 2A, which shows a block diagram illustrative of the Schmitt-trigger circuit of the invention. The Schmitt-trigger circuit in the FIG. 2A basically encompasses a comparison circuit 21, a first current cutting circuit 22, and a second current cutting circuit 23. The comparison circuit 21 receives the input signal ($V_{in}$) and then generates the output signal ($V_{out}$). The first current cutting circuit 22 receives $V_{out}$ and then generates a reference voltage level $V_f$ to feed back to the comparison circuit 21. Similarly, the second current cutting circuit 22 also receives $V_{out}$ and generates a reference voltage level $V_s$ to feed the comparison circuit 21. As noted, $V_f$ will cut the DC current path inside the comparison circuit 21 when $V_{in}$ rises to a lower trigger point ("$V_T-$" for short hereinafter). Moreover, $V_s$ will also cut the DC current path inside the comparison circuit 21 when $V_{in}$ falls to a higher trigger point ("$V_T+$" for short hereinafter).

Figure 1:
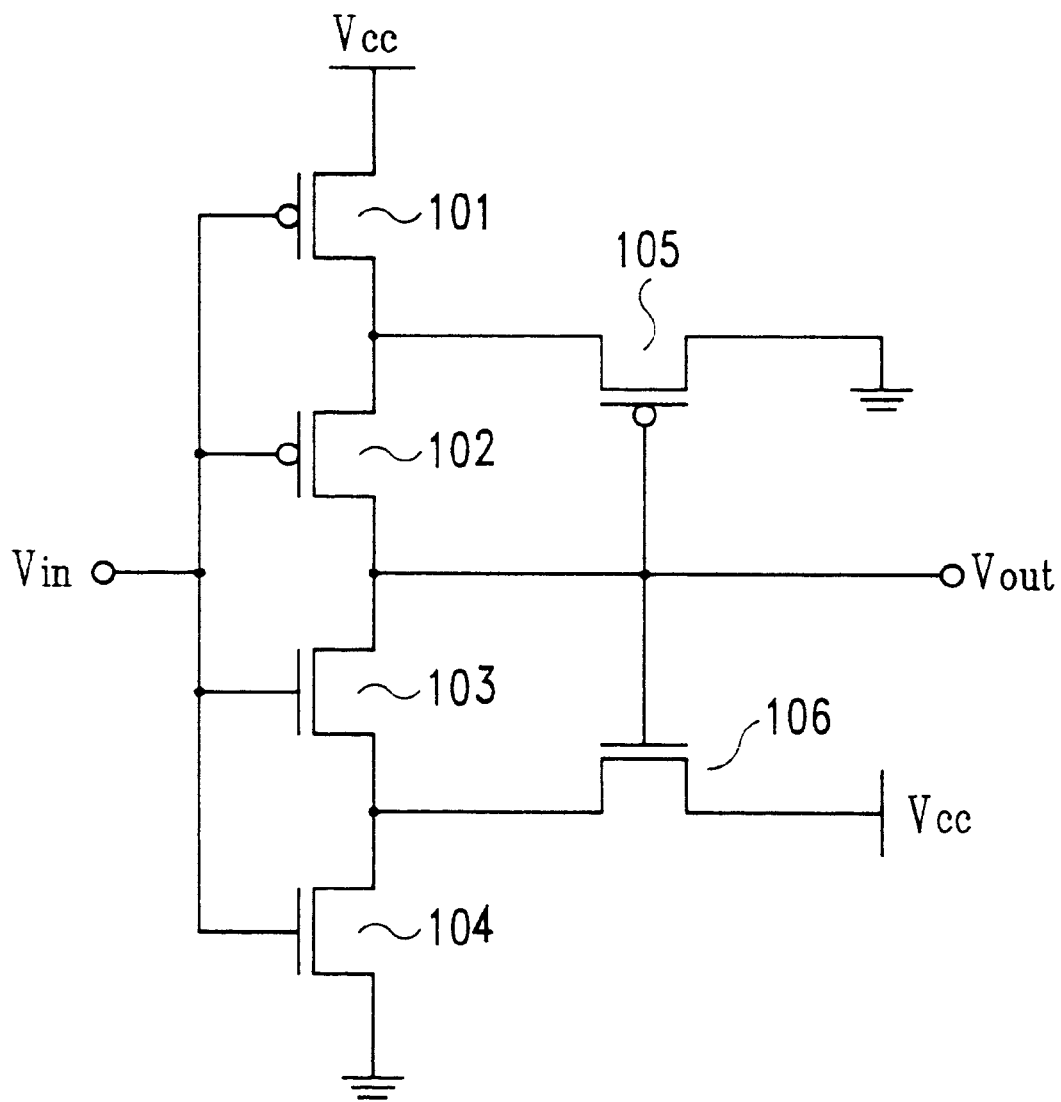
FIG. 1 represents a diagram illustrative of a Schmitt-trigger circuit used conventionally.
Figure 2B:
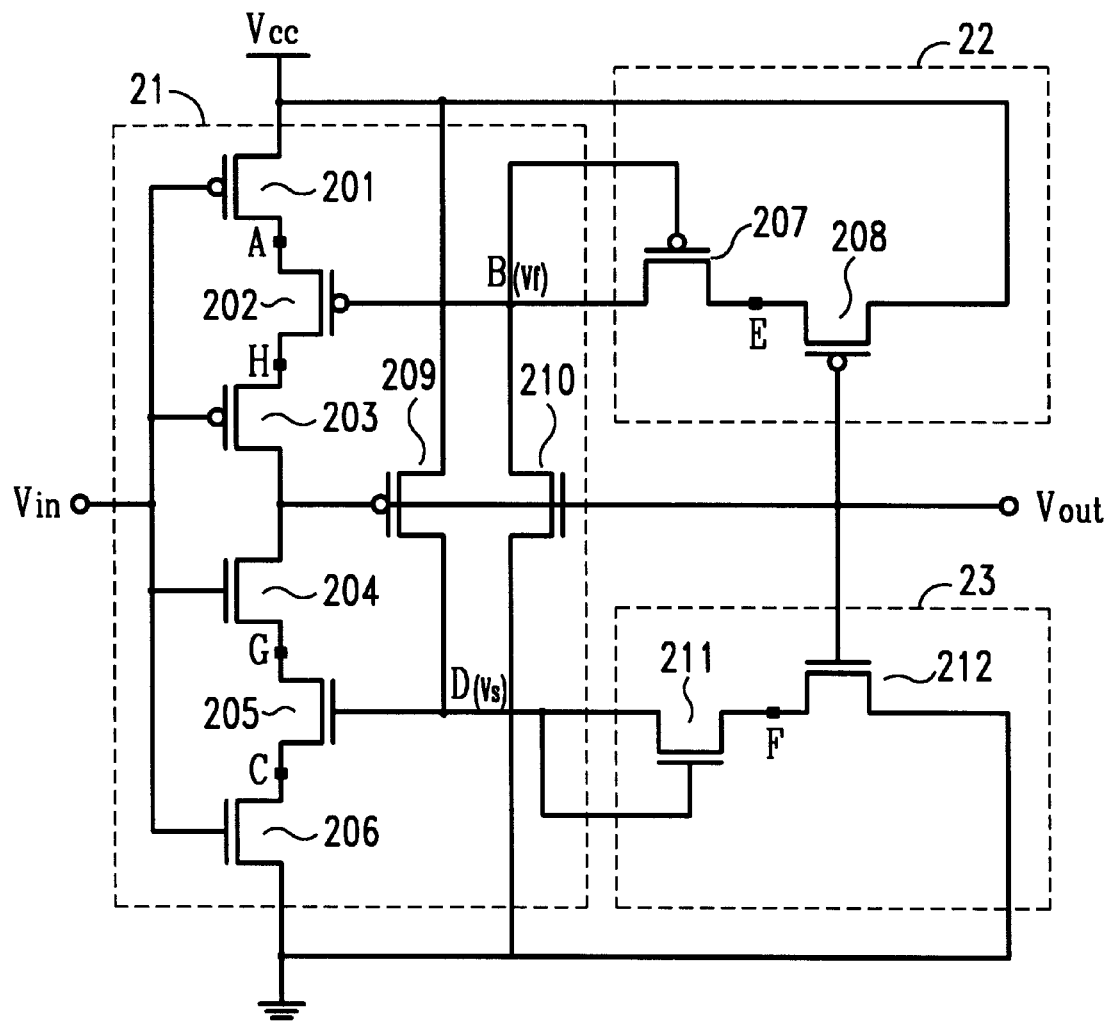
FIG. 2B is a detail circuit diagram representative of the Schmitt-trigger circuit in the FIG. 2A.

Please refer now to FIG. 2B, which demonstrates the detail circuit diagram of the FIG. 2A. The comparison circuit 21 includes four PMOS transistors 201, 202, 203, 209, and four NMOS transistors 204, 205, 206, 210. The gates of the transistors 201, 203, 204 and 206 are coupled to form the input terminal for receiving $V_{in}$. In comparison with the Schmitt-trigger circuit in the FIG. 1, the transistors 201, 203, 204 and 206 are also series connected across a source potential $V_{cc}$ to ground. However, two additional transistors 202 and 205 that are applied to respectively receive the reference voltage levels $V_f$ and $V_s$ from their gates. In addition, the gates of the transistors 209 and 210 are also tied together to form the output terminal for deriving $V_{out}$.

The first current cutting circuit 22 includes two PMOS transistors 207 and 208. The drain of the transistor 208 and the source of the transistor 207 are coupled together, and the gate of the transistor 208 is used to feed in $V_{out}$. The gate and the drain of the transistor 207 are tied together for generating $V_f$ to feed the comparison circuit 21. The second current cutting circuit 23 has the similar configuration with the first current cutting circuit 22. For example, the second current cutting circuit 23 encompasses two NMOS transistors 211 and 212. The drain of the transistor 211 and the source of the transistor 212 are also coupled together, and the gate of the transistor 212 is also used to receive $V_{out}$, too. The gate and the source of the transistor 211 are connected for generating $V_s$ to feed the comparison circuit 21.

In operation, when the voltage level of $V_{in}$ is at 0 (e.g., 0 volts, or ground potential), both the transistors 201 and 203 are conductive. The voltage levels of the node A and $V_{out}$ are at $V_{cc}$, and the voltage level of the node B (i.e., $V_f$) will be at 0 through the transistor 210. Furthermore, both the transistors 208 and 207 will not be turned on because $V_{out}$ is at $V_{cc}$. Clearly, a DC current path is thus established from $V_{cc}$, through the transistors 201, 202, 203 to the output terminal ($V_{out}$). On the other hand, both the transistors 204 and 206 will not conduct because $V_{in}$ is at 0. Therefore, the transistors 211 and 212 are not conducted, too.

Figure 4A:
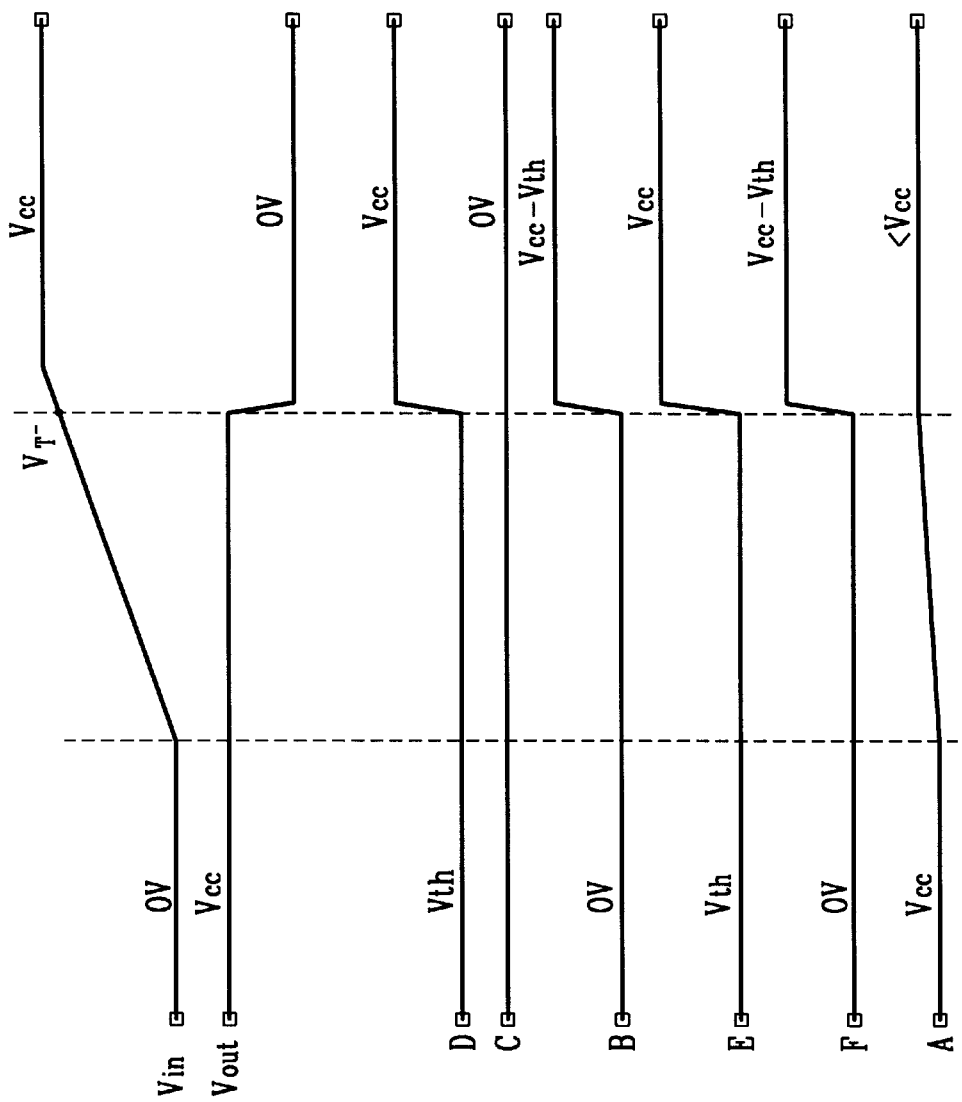
FIG. 4A depicts a waveform diagram representative of the variations of the voltage levels when the input signal rises to the lower trigger point.

All the logic states of the aforementioned transistors will not be changed when the voltage level of $V_{in}$ is less than the lower trigger point ($V_T-$). Assume $V_{in}$ increases in amplitude very slowly from 0 to $V_{cc}$, and all the transistors have the same threshold voltages $V_{th}$. At the moment that $V_{in}$ rises to the lower trigger point, there will be a DC current flow through the transistors 204, 205, 206 to ground. Accordingly, the voltage level at $V_{out}$ will be discharged and then fall to 0. When $V_{out}$ falls to 0, the transistor 208 will be conducted. Therefore, the voltage level of the node B will begin to rise through the transistor 207. Please note that the voltage level of the node E is $V_{cc}$ and the level of node B is $V_{cc}$ by a threshold voltage (i.e., $V_{cc}-V_{th}$). Although the voltage level of the node A starts to fall when $V_{in}$ starts to rise, however, node A still has a voltage level less than $V_{cc}$. Obviously, the gate-to-source voltage of the transistor 202 is less than $V_{th}$, and the transistor 202 will be turned off this moment. Accordingly, the above-mentioned DC current path that established from $V_{cc}$ to ground will be cut. On the other hand, the transistor 209 will be turned on to precharge node D more quickly. As noted, there will be no direct path to provide DC current from $V_{cc}$ to ground when $V_{in}$ continues to rise to $V_{cc}$, which indicates no more DC current will be consumed. FIG. 4A illustrates a waveform diagram representative of the aforementioned operations when $V_{in}$ rises from 0, through $V_T-$, to $V_{cc}$ slowly.

Because the Schmitt-trigger circuit of the invention is designed to have a symmetric circuit configuration, the operations when $V_{in}$ falls from $V_{cc}$ to 0 are quite similar as the operations when $V_{in}$ rises mentioned above. When the voltage level at $V_{in}$ is $V_{cc}$, both the transistors 204 and 206 will be conducted. The voltage levels of the node C and $V_{out}$ are at ground, and the voltage level of the node D (i.e., $V_s$) will be $V_{cc}$ through the transistor 209. Both the transistors 211 and 212 will not be conducted because $V_{out}$ is discharged to 0. Clearly, a DC current path is thus established from the output terminal ($V_{out}$), through the transistors 204, 205, 206 to ground. On the other hand, both the transistors 201 and 203 are not conducted because $V_{in}$ is at $V_{cc}$. Therefore, the transistors 207 and 208 are not conductive, too.

Figure 4B:
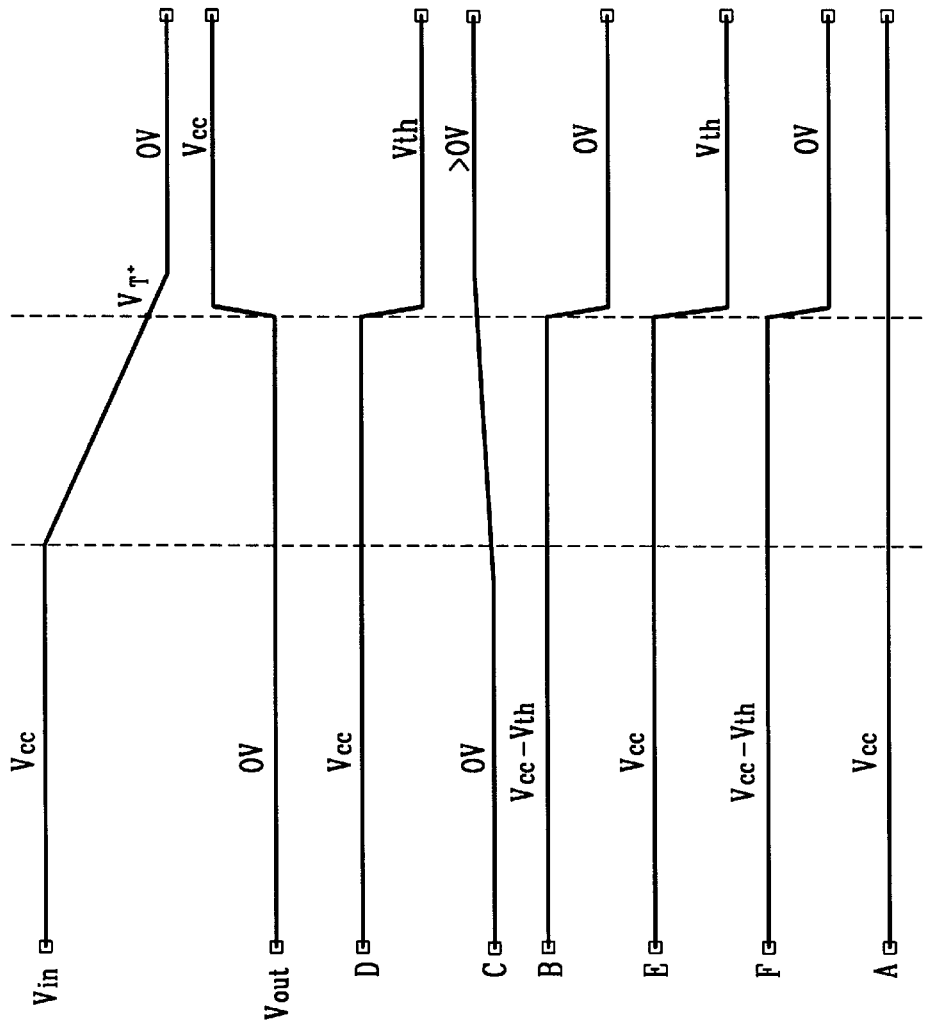
FIG. 4B depicts a waveform diagram representative of the variations of the voltage levels when the input signal rises to the higher trigger point.

When the voltage level at $V_{in}$ is still larger than the higher trigger point ($V_T+$), all the logic states of the aforementioned transistors will not be changed. Assume $V_{in}$ falls very slowly from $V_{cc}$ to 0, and all the transistors still have the same threshold voltages $V_{th}$. Accordingly, at the moment that $V_{in}$ falls to the higher trigger point ($V_T+$), the transistors 201, 202, 203 will be conducted. Moreover, the voltage level at $V_{out}$ will be charged and then rise to $V_{cc}$. When $V_{out}$ rises to $V_{cc}$, the transistor 212 will be conducted. Therefore, the voltage level of the node D will start to fall through the transistor 211. Please note that the voltage level of the node D is equal to $V_{th}$ and the level of node F will be ground. Although the voltage level of the node C starts to rise when $V_{in}$ starts to fall, however, node C still has a voltage level a little larger than 0. Obviously, the gate-to-source voltage of the transistor 205 will be less than $V_{th}$, and the transistor 205 will be turned off this moment. Clearly, the above-mentioned DC current path that established from output terminal ($V_{out}$) to ground will be cut. On the other hand, the transistor 210 will be turned on to discharge node B more quickly. As noted, there will be no direct path to provide DC current from output terminal to ground when $V_{in}$ continues to fall to 0, which indicates no more DC current will be consumed. FIG. 4B illustrates a waveform diagram representative of the aforementioned operations when $V_{in}$ falls from $V_{cc}$, through $V_T+$, to 0 slowly.

Figure 3A:
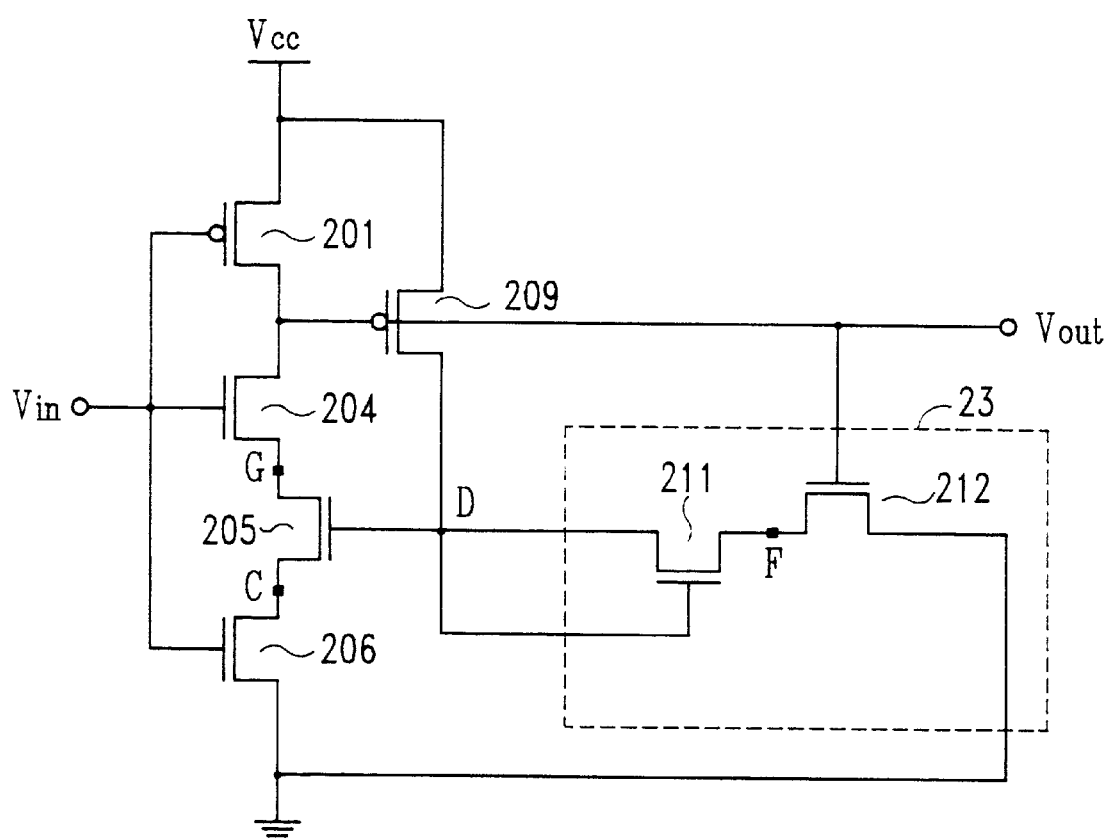
FIG. 3A shows a second embodiment of the invention when the extreme higher trigger point is required.
Figure 3B:
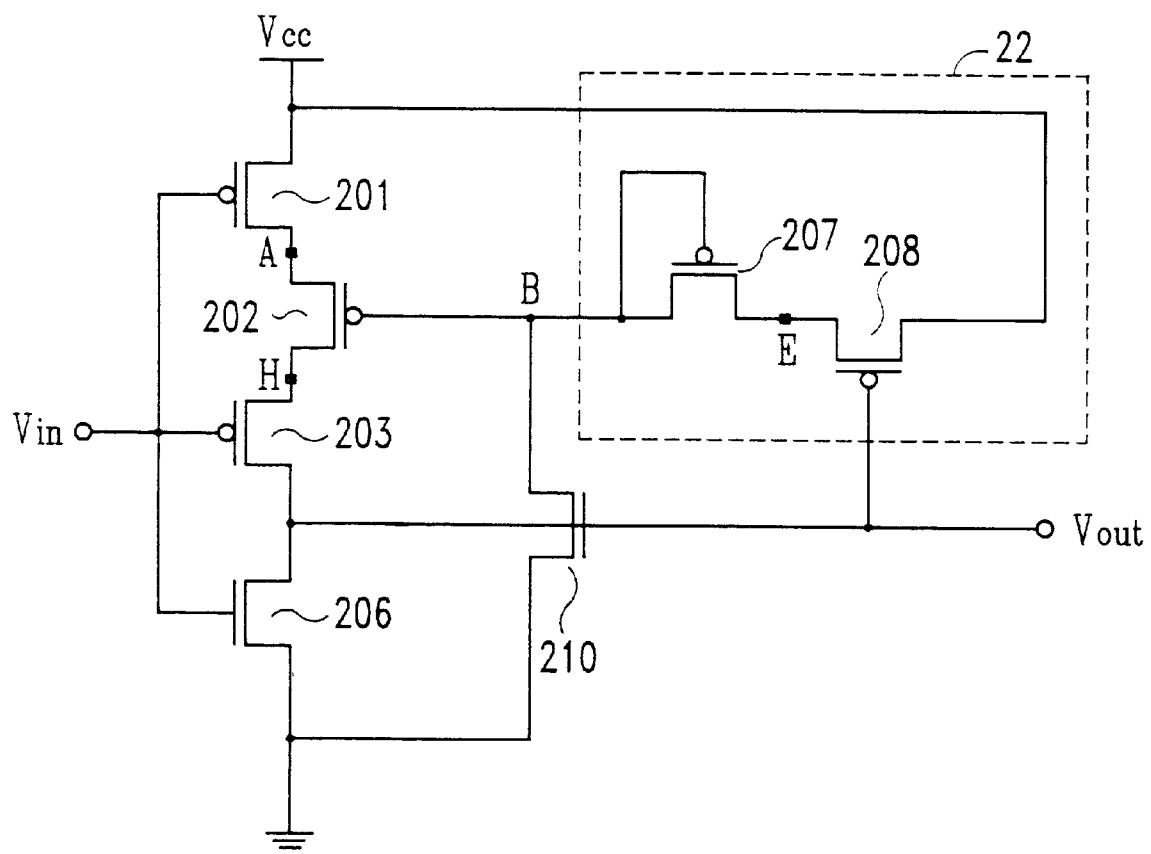
FIG. 3B shows a second embodiment of the invention when the extreme lower trigger point is required.

In addition, one of the first current cutting circuit 22 and the second current cutting circuit 23 can be eliminated if there is only the higher or lower trigger point is needed. For example, the FIG. 3A illustrates a circuit diagram representative of when only the second current cutting circuit 23 is applied for achieving the purpose of reserving only the higher trigger point $V_T+$. Similarly, the FIG. 3B shows another circuit diagram illustrative of when only the first current cutting circuit 22 is applied for achieving the purpose of reserving only the lower trigger point $V_T-$. As noted, the transistors 202 and 205 that respectively receive the reference voltage $V_f$ and $V_s$ will be removed at the same time. That is, the transistor 202 will be eliminated when only the second current cutting circuit 23 is used. More similarly, the transistor 205 will be removed when only the first current cutting circuit 22 is required. Thus, the extreme trigger points of the Schmitt-trigger circuit can be adjusted without necessary to vary the size-ratio of the PMOS and NMOS transistors.

Figure 5:
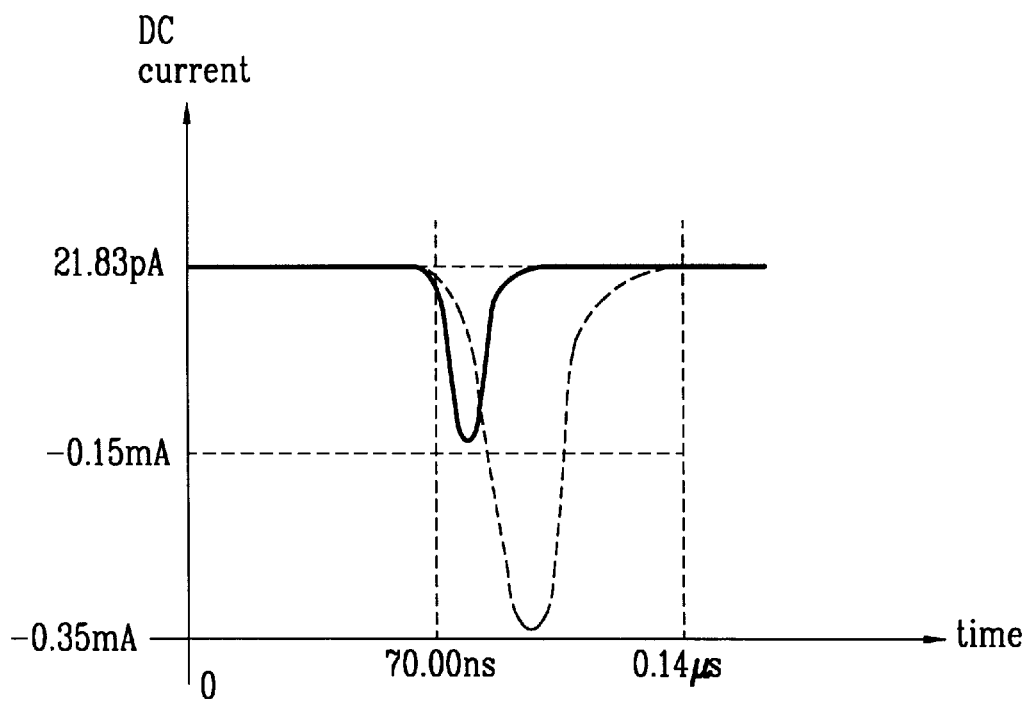
FIG. 5 demonstrates an example for describing the DC current that consumed by the circuits in the FIGS. 1 and 2B.

Referring now to FIG. 5, which depicts an example for describing the DC current that consumed by the Schmitt-trigger circuits in the FIGS. 1 and 2B. A curve illustrated by a dot-line describes the DC current consumed by the conventional Schmitt-trigger circuit in the FIG. 1. The other curve that indicated by a solid line is used to describe the consumed DC current versus time for the circuit of the present invention. Obviously, the disclosed Schmitt-trigger circuit gives better performances than the conventional circuit. For example, the time interval that consumes the DC current is about 10 nano seconds (ns). However, the time interval required in the conventional circuit is about 70 ns. Furthermore, the amount of the DC current consumed in the disclosed circuit is about 0.15 milli-amperes (mA). However, the DC current required in the conventional circuit is about 0.3 mA.

Figure 6:
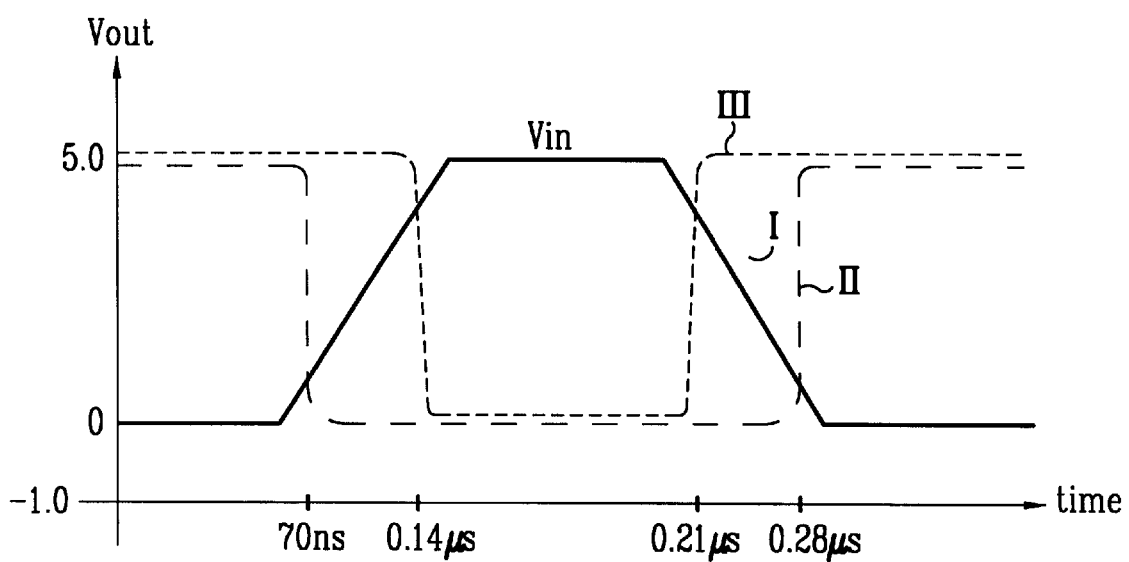
FIG. 6 illustrates a waveform diagram representative of the voltage variations of the FIGS. 1, 3A and 3B when the voltage level of the input signal changes.

FIG. 6 illustrates a waveform diagram representative of the potential variations of the FIGS. 1, 3A and 3B when the voltage level of the input signal changes. The curve represented by solid-lines is used to describe the variation of $V_{in}$ which slowly rises from 0 to $V_{cc}$, and then falls to 0 again. Curve I indicates the variations of the output terminal ($V_{out}$) when the conventional Schmitt-trigger circuit (of the FIG. 1) is used. Curve II is used to describe the variations at $V_{out}$ when the circuit in the FIG. 3B is applied. Moreover, curve III indicates the variations at $V_{out}$ when the circuit in the FIG. 3A is employed. Obviously, the extreme trigger points can be adjusted based on the circuit disclosed in the invention, without necessary to vary the size-ratio of the PMOS and NMOS transistors.

In conclusion, the present invention discloses a Schmitt-trigger circuit that consumes less electrical power by reducing the amount of the required DC current. The DC current path inside the comparison circuit of the Schmitt-trigger circuit will be completely cut when the voltage level of the input signal rises or falls to a predetermined trigger point. Portion of the current cutting circuits can be employed in the Schmitt-trigger circuit to adjust extreme trigger points. It is unnecessary to change the size-ratio of the NMOS and PMOS transistors as conventional.

As is understood by a person skilled in the art, the foregoing preferred embodiments of the present invention are illustrated of the present invention rather than limiting of the present invention. It is intended to cover various modifications and similar arrangements included within the spirit and scope of the appended claims, such as applying portions of the current cutting circuit to determine extreme trigger points, the scope of which should be accorded the broadest interpretation so as to encompass all such modifications and similar structure.

What is claimed is:

1. A Schmitt-trigger circuit that consumes less power by reducing an amount of a required DC (Direct Current) current, wherein said circuit comprises:

comparison means responsive to an input signal for generating an output signal, wherein said comparison means comprises:

a first MOS (Metal-Oxide-Semiconductor) transistor having a gate, a drain, and a source, said source of said first MOS transistor being coupled with a first reference voltage potential;

a second MOS transistor having a gate, a drain, and a source, said source of said second MOS transistor being coupled with a second reference voltage potential;

a third MOS transistor having a gate, a drain, and a source, said drain of said third MOS transistor being coupled with said drain of said second MOS transistor for generating said output signal, said gate of said third MOS transistor being coupled with said gate of said first MOS transistor, and said gate of said second MOS transistor for receiving said input signal; and a first feedback MOS transistor having a gate, a drain, and a source, said drain of said first feedback MOS transistor being coupled with said source of said third MOS transistor, said source of said first feedback MOS transistor being coupled with said drain of said first MOS transistor, said gate of said first feedback MOS transistor being used to receive said feedback signal to cut said current path inside said comparison means when said voltage level of said input signal rises to a lower trigger point of said predetermined threshold; and current cutting means responsive to said output signal and said input signal for generating a feedback signal to cut a current path inside said comparison means when a variation of a voltage level of said input signal is higher than a predetermined threshold.

2. The Schmitt-trigger circuit according to claim 1, wherein said current cutting means comprises:

a first cutting MOS transistor having a gate, a drain, and a source, said source of said first cutting MOS transistor being coupled a reference voltage potential, said gate of said first cutting MOS transistor being used to receive said output signal; and a second cutting MOS transistor having a gate, a drain, and a source, said source of said second cutting MOS transistor being coupled with said drain of said first cutting MOS transistor, said gate of said second cutting MOS transistor being coupled with said drain of said second cutting MOS transistor for generating said feedback signal.

3. The Schmitt-trigger circuit according to claim 1, wherein said first cutting MOS transistor, said first feedback MOS transistor, and said second cutting MOS transistor are PMOS transistors.

4. The Schmitt-trigger circuit according to claim 1, wherein said comparison means comprises:

a first MOS (Metal-Oxide-Semiconductor) transistor having a gate, a drain, and a source, said source of said first MOS transistor being coupled with a first reference voltage potential;

a second MOS transistor having a gate, a drain, and a source, said source of said second MOS transistor being coupled with a second reference voltage potential;

a fourth MOS transistor having a gate, a drain, and a source, said drain of said fourth MOS transistor being coupled with said drain of said first MOS transistor for generating said output signal, said gate of said fourth MOS transistor being coupled with said gate of said first MOS transistor, and said gate of said second MOS transistor for receiving said input signal; and a second feedback MOS transistor having a gate, a drain, and a source, said drain of said second feedback MOS transistor being coupled with said source of said fourth MOS transistor, said source of said second feedback MOS transistor being coupled with said drain of said second MOS transistor, said gate of said second feedback MOS transistor being used to receive said feedback signal to cut said current path inside said comparison means when a voltage level of said input signal falls to a higher trigger point of said predetermined threshold.

5. The Schmitt-trigger circuit according to claim 4, wherein said first cutting MOS transistor, said second feedback MOS transistor, and said second cutting MOS transistor are NMOS transistors.

6. A Schmitt-trigger circuit that consumes less power by reducing an amount of a required DC (Direct Current) current, wherein said circuit comprises:

comparison means responsive to an input signal for generating an output signal;

first current cutting means responsive to said output signal for generating a first feedback signal to cut a current path inside said comparison means when a voltage level of said input signal rises to a lower trigger point; and second current cutting means responsive to said output signal for generating a second feedback signal to cut said current path inside said comparison means when said voltage level of said input signal falls to a high trigger point.

7. The Schmitt-trigger circuit according to claim 6, wherein said comparison means comprises:

a first MOS (Metal-Oxide-Semiconductor) transistor having a gate, a drain, and a source, said source of said first MOS transistor being coupled with a first reference voltage potential;

a second MOS transistor having a gate, a drain, and a source, said source of said second MOS transistor being coupled with a second reference voltage potential;

a third MOS transistor having a gate, a drain, and a source;

a fourth MOS transistor having a gate, a drain, and a source, said drain of said fourth MOS transistor being coupled with said drain of said third MOS transistor for generating said output signal, said gate of said fourth MOS transistor being coupled with said gate of said first MOS transistor, said gate of said second MOS transistor, and said gate of said third MOS transistor for receiving said input signal;

a first feedback MOS transistor having a gate, a drain, and a source, said drain of said first feedback MOS transistor being coupled with said source of said third MOS transistor, said source of said first feedback MOS transistor being coupled with said drain of said first MOS transistor, said gate of said first feedback MOS transistor being used to receive said first feedback signal; and a second feedback MOS transistor having a gate, a drain, and a source, said drain of said second feedback MOS transistor being coupled with said source of said fourth MOS transistor, said source of said second feedback MOS transistor being coupled with said drain of said second MOS transistor, said gate of said second feedback MOS transistor being used to receive said second feedback signal.

8. The Schmitt-trigger circuit according to claim 6, wherein said first current cutting means comprises:

a first cutting MOS transistor having a gate, a drain, and a source, said source of said first cutting MOS transistor being coupled a reference voltage potential, said gate of said first cutting MOS transistor is used to receive said output signal; and a second cutting MOS transistor having a gate, a drain, and a source, said source of said second cutting MOS transistor being coupled with said drain of said first cutting MOS transistor, said gate of said second cutting MOS transistor being coupled with said drain of said second cutting MOS transistor for generating said first feedback signal.

9. The Schmitt-trigger circuit according to claim 8, wherein said first cutting MOS transistor, said first feedback MOS transistor, and said second cutting MOS transistor are PMOS transistors.

10. The Schmitt-trigger circuit according to claim 6, wherein said second current cutting means comprises:

a third cutting MOS transistor having a gate, a drain, and a source, said source of said third cutting MOS transistor being coupled with a reference voltage potential, said gate of said third cutting MOS transistor being used to receive said output signal; and a fourth cutting MOS transistor having a gate, a drain, and a source, said source of said fourth cutting MOS transistor being coupled with drain of said third cutting MOS transistor, said gate of said fourth cutting MOS transistor being coupled with said drain of said fourth cutting MOS transistor for generating said second feedback signal.

11. The Schmitt-trigger circuit according to claim 10, wherein said third cutting MOS transistor, said second feedback MOS transistor, and said fourth cutting MOS transistor are NMOS transistors.

12. A method for reducing power consumption of a Schmitt-trigger circuit, said method comprising the steps of:

inputting an input signal;

generating an output signal by using said input signal;

generating a feedback signal by using said output signal and said input signal; and cutting a current path inside said Schmitt-trigger circuit by using said feedback signal when a variation of a voltage level of said input signal is higher than a predetermined threshold.

13. The method according to claim 12, wherein said current path inside said Schmitt-trigger is cut when said voltage level of said input signal rises to a lower trigger point of said predetermined threshold.

14. The method according to claim 12, wherein said current path inside said Schmitt-trigger is cut when said voltage level of said input signal falls to a higher trigger point of said predetermined threshold.

15. The method according to claim 12, wherein said output signal is substantially an inverted phase of said input signal.

* * * * *